US010011051B2

(12) United States Patent
Alfani et al.

(10) Patent No.: US 10,011,051 B2
(45) Date of Patent: Jul. 3, 2018

(54) LOW THICKNESS CEMENTITIOUS PRODUCT WITH ELEVATED SURFACE QUALITIES FOR NON-STRUCTURAL APPLICATIONS, AND METHOD FOR ITS MANUFACTURE

(75) Inventors: Roberta Alfani, Bergamo (IT); Claudia Cappone, Cassina De'Pecchi (IT); Flavio Rampinelli, Urgnano (IT)

(73) Assignee: Italcementi S.P.A., Bergamo (IT)

( * ) Notice: Subject to any disclaimer, the term of this patent is extended or adjusted under 35 U.S.C. 154(b) by 226 days.

(21) Appl. No.: 14/343,900

(22) PCT Filed: Sep. 12, 2012

(86) PCT No.: PCT/EP2012/067762
§ 371 (c)(1),
(2), (4) Date: Mar. 10, 2014

(87) PCT Pub. No.: WO2013/037792
PCT Pub. Date: Mar. 21, 2013

(65) Prior Publication Data
US 2014/0216533 A1 Aug. 7, 2014

(30) Foreign Application Priority Data
Sep. 12, 2011 (IT) .............................. MI2011A1642

(51) Int. Cl.
*B29C 33/56* (2006.01)
*C04B 28/04* (2006.01)
*B28B 7/36* (2006.01)
*B29C 39/00* (2006.01)
*B29C 39/36* (2006.01)
*E04C 2/26* (2006.01)
*H01L 31/0352* (2006.01)
*C04B 111/20* (2006.01)
*C04B 111/34* (2006.01)

(52) U.S. Cl.
CPC .............. *B29C 33/56* (2013.01); *B28B 7/364* (2013.01); *B29C 39/003* (2013.01); *B29C 39/36* (2013.01); *C04B 28/04* (2013.01); *E04C 2/26* (2013.01); *H01L 31/0352* (2013.01); *C04B 2111/2061* (2013.01); *C04B 2111/346* (2013.01); *Y10T 428/24355* (2015.01); *Y10T 428/24421* (2015.01)

(58) Field of Classification Search
CPC .............. C04B 20/0076; C04B 28/04; C04B 2111/2061; C04B 2111/346; B29C 33/56; B29C 39/003; B29C 39/36; B28B 7/364; E04C 2/26; H01L 31/0352
See application file for complete search history.

(56) References Cited

U.S. PATENT DOCUMENTS

| 5,378,279 A * | 1/1995 | Conroy ............... C04B 20/0076 106/719 |
| 2004/0031219 A1 | 2/2004 | Banister |
| 2005/0005821 A1 | 1/2005 | Colombet et al. |
| 2006/0147756 A1* | 7/2006 | Cassar ................. C04B 14/305 428/703 |
| 2006/0207479 A1* | 9/2006 | Hughes ................... C04B 28/02 106/705 |
| 2007/0163470 A1* | 7/2007 | Chanut .................. C04B 28/02 106/724 |
| 2007/0266906 A1* | 11/2007 | Garcia ................ C04B 22/0026 106/817 |
| 2009/0305019 A1* | 12/2009 | Chanvillard .......... C04B 22/008 428/220 |
| 2010/0043673 A1* | 2/2010 | Batoz ...................... C04B 28/04 106/640 |
| 2010/0330318 A1* | 12/2010 | Alfani .................. C04B 28/065 428/36.91 |

FOREIGN PATENT DOCUMENTS

| KZ | 11972 A1 | 9/2002 |
| RU | 2131856 C1 | 6/1999 |
| WO | WO2006097272 A2 * | 9/2006 |

OTHER PUBLICATIONS

Girard, Jeff. "The role of aggregate in concrete countertop mix formulas". Mar. 2011. Retrieved from http://www.concretecountertopinstitute.com/blog/2011/03/the-role-of-aggregate-in-concrete-countertop-mix-formulas/.*
Structure and Energy-saving Analysis of Thin-film Photovoltaic Curtain Wall, Zhang Jun_mei, etc. Gas & Heat, vol. 30, No. 5, pp. 21-23, May 2010. Abstract.
Miller, et al., "Surface Roughness Criteria for Cement Paste Nanoindentation," Cement and Concrete Research 38:467-476 (2008).
Jun-mei Zhang et al., Structure and Energy-saving Analysis of Thin-film Photovoltaic Curtain Wall, (Jun. 24, 2010) (5 pages).
Translation of the Examination Report and Search Report for Taiwanese Patent Application No. 101132427 dated Apr. 22, 2016 (7 pages).

* cited by examiner

Primary Examiner — Anthony J Green
(74) Attorney, Agent, or Firm — Abelman, Frayne & Schwab

(57) ABSTRACT

Aim of the present invention is to obtain cementitious products having smooth, planar surfaces and low thickness for applications having aesthetic purpose, of integrated architecture or as substrates, for example for a thin-film photovoltaic unit, with controlled curling and surface roughness, manufactured by mold casting of a fluid composition comprising: I. a hydraulic binder; II. one or more aggregates; III. an anti-shrinkage agent; IV. a superplasticizer agent; V. water, wherein the percentage by weight of said hydraulic binder in the composition is lower than that of said aggregates, and wherein said aggregates have a maximum diameter $d_{max}$ not greater than one third of the thickness of the product, the final product thus having an arithmetic mean surface roughness Ra not greater than 500 nm and curling not greater than 1500 micron.

26 Claims, No Drawings

LOW THICKNESS CEMENTITIOUS PRODUCT WITH ELEVATED SURFACE QUALITIES FOR NON-STRUCTURAL APPLICATIONS, AND METHOD FOR ITS MANUFACTURE

CROSS-REFERENCE TO RELATED APPLICATIONS

This application is a National Phase of PCT/EP2012/067762, filed 12 Sep. 2012, which claims priority from Italian Application No. MI2011A001642, filed 12 Sep. 2011, the disclosures of which are all incorporated herein by reference.

FIELD OF THE INVENTION

The aim of the present invention is to obtain cementitious products having smooth, planar surfaces and of low thickness, for applications having aesthetic purpose of integrated architecture or as supports, for example for a thin-film photovoltaic unit.

PRIOR ART

In patent application MI2010A000670 of the same Applicant, low thickness and low roughness cementitious products are described which are manufactured by calendering followed by compression moulding. Because compression moulding is not generally a process conventionally used for treating cementitious liquid mixtures, increasing the dimensions of the product to be moulded can give rise to ever-increasing technical difficulties. Reference is made in particular to problems of curvature, also known as curling problems, which are typical of products having a high surface/volume ratio. Furthermore, the intrinsic characteristics of the calendering and moulding process necessitate a plastic starting material of high viscosity and semi-solid consistency, similar to material such as grès and clay etc, which are barely fluid in the fresh state. The present invention has the aim of resolving this technical problem.

SUMMARY OF THE INVENTION

To this end, the invention proposes a low thickness cementitious product, in particular in the shape of a slab having controlled curling and surface roughness, characterised in that it is manufactured by casting in a mould a fluid composition comprising:
I. A hydraulic binder
II. One or more aggregates
III. An anti-shrinkage agent
IV. A superplasticizer agent
V. Water,
wherein the percentage by weight of said hydraulic binder in the composition is lower than that of said aggregates, and wherein said aggregates have a maximum diameter not greater than one third of the thickness of the product, the final product thus having an arithmetic mean surface roughness Ra not greater than 500 nm and curling not greater than 1500 micron.

DETAILED DESCRIPTION OF THE INVENTION

In a preferred embodiment, said casting mould is of the type having vertical walls. Especially advantageous is a metallic casting mould having vertical walls for cementitious applications consisting of two die halves whose inner surface is at least partly or fully coated by material selected from polyethylene terephthalate, polycarbonate, polyamide, polymethyl methacrylate, or other similar material capable of imparting arithmetic mean surface roughness Ra not greater than 500 nm to the cementitious product during the forming step.

The vertical-walled mould may be of the multiple type, that is, composed of a series of a plurality of walls distanced and linked together, at least partly or fully internally coated, adapted to produce simultaneously a plurality of products of equal or differing thickness.

1. More preferably, such vertical walls are coated, at least partly, with materials such as polyethylene terephthalate like Mylar® and similar, polycarbonate, polyamide, polymethyl methacrylate, capable of imparting to the cementitious product the surface characteristics and roughness which are the subject of the invention.

In a further preferred embodiment, the said starting fluid composition for moulding the cementitious product of the invention comprises, as the further component VI, a water-repelling agent having the principal function of conferring water impermeability upon the final cementitious product.

The said components I to IV of the composition according to the present invention will now be described in detail.

I. By hydraulic binder is understood a pulverised material in the dry solid state which, when mixed with water, forms plastic pastes capable of setting and of hardening like a cement, even under water. A clinker usable for preparing a binder of the present invention is any clinker of ordinary cement, as defined according to the standard UNI EN 197.1, that is, a hydraulic material composed of at least two thirds by mass of calcium silicates ($3CaO.SiO_2$) and ($2CaO.SiO_2$), the remainder being $Al_2O_3$, $Fe_2O_3$ and other oxides; for example a clinker of Portland cement. Within the broad definition of hydraulic binder according to the present invention will be understood both white, grey or pigmented cements according to the previously cited standard UNI EN 197.1, and the so-called retaining-wall cements, cementitious agglomerates and hydraulic limes is as defined in the Italian law of 26 May 1965 n. 595, and inorganic silicates.

To form a product according to the present invention, binders based on calcium sulfoaluminates, such as the compounds described in the patents and/or patent applications WO2006/18569, EP-A-1306356 and EP-A-0181739, as well as those derived from calcium sulfoaluminate clinkers described in the Review "Green Chemistry for sustainable cement production and Use" by John W. Phair, Green Chem., 2006, 8, 763-780, in particular section 5.3 on page 776, and from calcium sulfoaluminate clinkers described in the article "Calcium sulfoaluminates cements—low energy cements, special cements" J. H. Sharp et al., Advances in Cement Research, 1999, 11, n. 1, pp. 3-13. Alternatively, aluminate and sulfo-ferroalluminate cements may also advantageously be used, as described in Advances in Cement Research, 1999, 11, No. 1, January, 15-21.

According to the present invention, photocatalytic cements may also be used for manufacturing the products, that is, binders having photocatalytic activity which are obtained by adding to the mixture a photocatalyst capable of oxidising—in the presence of light, air and moisture—the organic and inorganic contaminants present in the environment.

The photocatalyst may be selected from any compound capable of oxidising, in the presence of light, oxygen and water, the contaminants which come into contact with the surface of the cementitious compositions in the hardened state, because in nature this does not counter-productively affect the physicomechanical characteristics of the cementitious compositions used in the invention. The preferred catalyst according to the present invention is titanium oxide or one of its precursors and more typically titanium oxide at least partly in the anatase form. The expression "titanium oxide at least partly in the anatase form" means that the particles of titanium oxide have an anatase structure in 5%, preferably 25%, more preferably at least 50%, and yet more preferably at least 70%, as percentages by weight of the total titanium oxide. Examples of photocatalytic cements are the products of the TX range (Italcementi), such as TX Arca®, TX Aria®.

In a preferred embodiment of the invention, the binders used are the sulfoaluminate cement Alipre® Cement from Italcementi, the Portland cement Ultracem® 52, 5R from Italcementi, the cement Italbianco® 52, 5R from Italcementi and the cement TX Arca® from Italcementi.

The composition for manufacturing a product according to the present the fifth of invention may also optionally comprise anhydride or gypsum.

According to the present invention, the ratio between the amount of hydraulic binder as weight percent and the amount of total aggregates as weight percent of the weight of the composition is less than 1, preferably in the range from 5% to 60%, more preferably from 10% to 50%, yet more preferably from 15% to 40%.

II. The aggregates or inert agents, also defined as inert aggregates, according to the present invention may comprise:

fines such as fillers, powders and sands defined in the UNI EN 206 standard, by filler according to the invention will be understood a fines fraction having a maximum diameter, $d_{max}$, equal to 40 micron;

non-fines having $d_{max}$ greater than 40 micron.

The percentage of filler relative to that of the aggregates, as defined according to the present invention, is preferably in the range from 15% to 60%.

The aggregates have a maximum diameter $d_{max}$ no greater than one third of the product thickness. The maximum diameter $d_{max}$ of the aggregates is preferably lower than one third of the product thickness. A typical value of $d_{max}$ according to the invention is 1.5 mm, corresponding to a product thickness no greater than 4.5 mm.

By way of non-limiting indication, the range of thickness of the cementitious product of interest for the purposes of the intention is in general from 3 to 50 mm. The aggregates may advantageously be selected from calcareous aggregates, of quartz or silico-calcareous materials, of any shape, or crushed, or spherical, for example pulverised marble, ceramics, and also of types made lighter to reduce the final weight of the product.

In a preferred embodiment of the invention, said the aggregates together comprise the following fractions: aggregates having a diameter in the range from 0.20 to 0.35 mm, aggregates having a diameter in the range from 0.60 to 0.80 mm, aggregates having a diameter in the range from 1.00 to 1.50 mm, filler having a diameter in the range from 0.1 to 40 µm, powder having a diameter in the range from 0.1 to 0.8 mm, marble granules having a diameter in the range from 0.1 to 100 µm, marble granules having a diameter in the range from 0.10 to 0.60 mm.

In a further preferred embodiment of the invention, the aggregates used are in particular the following aggregates identified as A, B, C, D, E, F and G respectively:

A—the fraction named "113" of silico-calcareous alluvial aggregates from Sataf company, having a diameter in the range from 0.20 to 0.35 mm,
B—the fraction named "103" of silico-calcareous alluvial aggregates from Sataf, having a diameter in the range from 0.60 to 0.80 mm,
C—the fraction named "117F" of silico-calcareous alluvial aggregates from Sataf, having a diameter in the range from 1.00 to 1.50 mm,
D—filler type calcareous aggregates having a diameter in the range from 0.1 to 40 µm, from Cremaschi company,
E—powder type calcareous aggregates having a diameter in the range from 0.1 to 0.8 mm, from Cremaschi company,
F—"very fine" marble granules having a diameter in the range from 0.1 to 100 µm, from Valli Granulati company,
G—"dust-free" marble granules having a diameter in the range from 0.10 to 0.60 mm, from Valli Granulati company, in the colours Carrara white and Zandobbio white.

With regard to the above-mentioned requirement for the maximum diameter of the aggregate relative to the thickness of the final product, the relative percentage amount of aggregates of different dimensions is then optimised so as to obtain the desired low roughness; furthermore, said roughness contributes to conferring on the mortar rheological characteristics adapted to mould casting, in particular elevated fluidity, prolonged workability for the time necessary for casting, and absence of segregation phenomena prior to hardening, safeguarding the final mechanical properties of the hardened product.

Some aggregates, such as in the case of coloured pulverised marble, also perform an aesthetic function; more specifically, they are able to confer particular characteristics of colour and hue or grain to the product, reproducing the appearance of natural stone.

Optionally, the mixture may also contain one or more auxiliary substances commonly used in the field, such as charges of mineral or pozzolanic origin, organic and/or inorganic pigments etc. Mineral or pozzolanic charges will be understood as microsilica, silica fume, slag, fly ash, metakaolin, natural pozzolans, natural limestones, and precipitated calcium carbonates.

III. In order to manufacture the product according to the present invention, the starting cementitious composition must contain at least one anti-shrinkage agent or additive having the ability to reduce hygrometric shrinkage, in a liquid phase or solid phase. These anti-shrinkage agents, also known as SRAs (shrinkage reducing agents) include a wide variety of glycols and diols, or polyols, or glycolic ethers, or mixtures of glycolic ether derivatives, and are responsible for the reduction in shrinkage deformation throughout the operating life of the hardened product. Lime may be added in combination therewith.

In a preferred aspect of the invention, in respect of anti-shrinkage additive III, the commercially available product Espandex from Axim in aqueous solution is used, or as glycolic ethers or mixtures of glycolic ether derivatives, the commercially available product Shape 920 from Elotex, in solid form.

IV. According to the present invention, the cementitious starting composition must contain at least one superplasticizer agent or additive, preferably selected from polymers of polycarboxylic type, added either in solid phase or in the form of an aqueous solution. In a preferred embodiment of the invention, polycarboxylic superplasticizers selected from among the commercially available product Cimfluid Adagio P1 from Axim in solid form, or the product Driver 72 Axim in liquid form. Combined use of the superplasticizer components IV and anti-shrinkage additive III allows the desired rheological characteristics to be optimised, with a low water-binder ratio, and hygrometric shrinkage measured up to 28 days to be appreciably reduced. Water-binder ratio will be understood as the ratio between the total amount of water used in the formulation of the composition and the amount of hydraulic binder I as previously defined.

VI. For the purpose principally of conferring water impermeability on the final cementitious product by limiting the water absorption thereof by capillarity, the starting fluid composition according to a preferred embodiment of the present invention comprises at least one water-repellent agent (component VI of the composition). Said agent may be selected from a wide range of organic compounds such as sodium oleates, or organosilicon substances such as alkyloxysilanes.

In a preferred aspect of the invention, Ligaphob N(T) 90 from Peter Greven (90% pulverised sodium oleate) or Seal 200 from Elotex (alkyloxysilane) are used as the water-repellent agent VI, in solid form.

In addition to the above-mentioned components, the composition in the form of castable mortar used to manufacture the product which is the subject of the present invention may contain various other additives to finely adapt the characteristics of the binder to the specific requirement. Examples of these additives may be setting regulators, rheology modifiers or modifiers of physicomechanical properties, such as for example cellulose or lactic substances, expanders, air entrainers, air-release agents, anti-foaming agents including, for example, alkoxysilate compounds on an inorganic carrier, such as the commercially available product Agitan P845. Such additives are optional for the purposes of the invention.

The cementitious mixture which is the subject of the present invention may also comprise the addition of fibres of various nature, such as inorganic fibres like metallic fibres or fibres of glass and wollastonite, and organic fibres such as fibres based on polyvinyl alcohol or polypropylene or aramid fibres, selected on the basis of the final application. Such fibres may be added as such, or also in the form of films or mesh networks, and may be used to reduce the fragility of the cementitious product, being selected according to the final characteristics of the product and of the use thereof.

To impart a better understanding of the characteristics and advantages of the invention, in what follows is presented a non-limiting example of a method for manufacturing a cementitious product that is the subject of the invention.

The first step is intimate mixing of the said components I to IV, optionally together with component VI, without the component water V; water V is then added to achieve a highly fluid mortar, mixing being protracted for a variable time depending on the mixer used. The highly fluid mortar is then poured into casting moulds which confer on the product the final geometry and the profile of desired surface roughness. The moulds are preferably casting moulds having vertical walls.

A planetary-type mixer is charged with:
  a solid, cementitious-based mixture comprising one or more components selected from cement, sand, aggregates, charges of mineral or pozzolanic origin, additives in solid form, rheology modifiers, fibres, pigments,
  water, stored in a liquid dispenser,
  any additives in liquid form.

The solid-phase components are mixed in the planetary-type mixer for a time preferably in the range from 30 seconds to 5 minutes, depending on the characteristics of the mixture and the external temperature, until a homogenous mixture is obtained. The liquid components are then added, including water, and mixing is continued for a time in the range from 30 seconds to 10 minutes, again depending on the mixer characteristics and the external temperature. The mortar in the cold state thus obtained is poured by means of an appropriate channel into moulds having a micrometric surface roughness.

In a variant embodiment, to reduce the fragility of products of greater surface area inside the mould, a reinforcing network is positioned in place, which remains submerged within the poured mass. The elevated fluidity enables homogenous filling of the mould, in combination with the application of vibrations to compact the poured mass and promote escape of any trapped mechanical air. Metallic moulds of the type used for cementitious applications are preferably used, consisting of two paired halves the internal surface of which is coated with materials such as polyethylene terephthalate, e.g. Mylar® and the like, polycarbonate, polyamide, polymethyl methacrylate and the like, capable of imparting to the cementitious product the surface characteristics and roughness that are the subject of the invention. Yet more preferably, recourse is made to the use of a mould consisting entirely of the above-mentioned plastic materials capable of imparting to the cementitious product the surface characteristics and roughness that are the subject of the invention, without the need to have recourse to mould/counter mould pairing.

After 24 hours it is possible to demould the product in order to subject it to the seasoning step, which takes place by maintaining it in a vertical position, preferably in a room air-conditioned to 20° C. and 55% relative humidity. Cementitious products varying in shape and low thickness are thus manufactured, depending on the final application.

In the products according to the present invention, the measure of surface roughness, arithmetic mean Ra, is obtained by means of a non-contact optical profilometer, such as 3D Talysurf CCl Lite (Taylor-Hobson), equipped with automatic stage and autofocus. The system uses green light interferometry in scansion to obtain images and measures of the parts analysed, providing quantitative information on the structure of surfaces without physical contact with said system.

The 3D data characterising the obtainable surfaces are as follows:
Height parameters: Sq, SSk, Sku, Sp, Sv, Sz, Sa, defined in accordance with the standard ISO 25178;
Parameters of planarity: FLTt, FLTp, FLTv, FLTq defined in accordance with the standard ISO 12781;
The surface-characterising 2D data obtainable using the technique described are as follows:
Height parameters—roughness profile: Rp, Rv, Rz, Rc, Rt, Ra, Rq, Rsk, Rku, defined according to the standard ISO 4287;
Spacing parameters—roughness profile: RSm, Rdq, defined according to the standard ISO 4287;
Peak parameters—roughness profile: RPc, defined according to the standard ISO 4287.

The invention also has as its subject a thin-film photovoltaic unit characterised in that it comprises the cementitious product defined above as the substrate for application of the actual film.

In the case of use of the above-mentioned substrates for successive deposition of the thin-film photovoltaic cells such as CIGS, the cementitious slab according to the present invention is preferably subjected to a test of resistance to the conditions of vacuum required by the film-deposition process. The recorded variation in surface roughness showed to the compatibility of the cementitious substrate with the simulated conditions of the process of the position of the photovoltaic film layer on which CIGS is based. Thus, even a test of permanence of the sample for one hour at 500° C. must not involve variations in the roughness profile that are significant for the purposes of application of a thin film of the CIGS type.

The measure of curling of the plate was obtained by means of a thin-layer shrinkage system, consisting of two horizontally aligned laser units, which measure the relative displacement in micrometers at two positions (the centre and one corner of the panel) selected as a reference, as a function of time. The acquired data are collected by a data logger and worked up so as to be able to appreciate the size differences which the panel has undergone over time. The value taken as the reference was measured after 28 days of maturation of the product.

In general, a low thickness product according to the invention is adapted to a non-structural use, principally as an element of architectonic coating or as a substrate suitable for being covered with a thin film having photovoltaic properties so as to comprise a photovoltaic unit with a film that is continuous, homogenous and as thin as possible, both functionally and aesthetically compatible with the surrounding architectonic context.

Finn-film photovoltaic unit will be understood as any unit produced according to thin-film technology, based on the use of amorphous silicon, CIS or CIGS and CdTE or on components of organic or hybrid nature (organic-inorganic). In a preferred aspect of the invention, the application of the cementitious product as a substrate for GIGS technology is considered.

In view of the application of a photovoltaic film of the CIGS type, the substrates, which are generally made of a plastic or vitreous material, must have surfaces of arithmetic mean surface roughness and minimum thicknesses, relative to the specific application.

The critical arithmetic mean roughness of the support or substrate as defined above for the purposes of the invention is therefore generally inferior to the mean thickness of the thin-film having photovoltaic properties to be applied to said substrate, which is of the micrometric order, thus making it possible to produce thin-film photovoltaic units such as CIGS, that are continuous and homogeneous with reduced use of material having photovoltaic properties.

The prefabricated cement products that are the subject of the present invention are intended for use in the construction sector, preferably for non-structural applications such as coating and covering elements of both the horizontal and vertical type, such as slabs, ventilated facades, infill panels, and decorative or cladding elements for internal walls.

Such cementitious substrates are particularly suited to the field of the so-called building integration photovoltaic (BIPV) for an ideal integration of the photovoltaic units within the urban architectonic context. Example applications of products and slabs for photovoltaic systems are: cladding panels for facades, fencing boards, cantilevered roofs, slabs and tiles for flooring, sunshade elements, solar protection systems.

The following examples of composition in preparation of a cementitious product according to the invention illustrate the invention without in any way limiting the scope thereof. Here in reference is made to the aggregates identified above as A, B, C, D, E, F and G.

Example 1

The solid components shown in Table 1 below were mixed in a Hobart intensive mixer for 3 minutes.

TABLE 1

| COMPONENTS | Weight % |
| --- | --- |
| Ultracem ® 52,5R cement (Italcementi) | 17.3 |
| Filler D | 20.8 |
| Powder E | 11.2 |
| Aggregate A | 11.2 |
| Aggregate B | 15.1 |
| Aggregate C | 15.0 |
| Driver 72 Axim Italia | 0.4 |
| Espandex 2000 | 0.4 |
| Water | 8.6 |

The liquid components are then added, including the water, and mixing is continued for a time equal to three minutes as a function of the characteristics of the mixture and of the external temperature. The maximum diameter of the aggregate used is that of aggregate C, equal to 1.5 mm.

The mortar in the fresh state thus obtained is poured by means of a suitable channel into moulds having a micrometric surface roughness. The elevated fluidity allows homogenous filling of the mould, also by means of vibrations to compact the poured mass. Recourse is preferably made to the use of metallic moulds of the type used for cementitious applications, consisting of two paired halves, the internal surface of which is coated with polycarbonate, capable of imparting to the cementitious product the surface characteristics and roughness that are the subject of the invention. The vertical geometry of the mould enables effective reduction of the phenomenon of curling due to plastic shrinkage that is further accentuated by pouring into horizontal, open-cast moulds.

After 24 hours it is possible to demould the product to subject it to the seasoning step, which takes place by maintaining it in a vertical position, in a room air-conditioned to 20° C. and 55% relative humidity. A product of dimensions 40×40 cm and thickness equal to 5 mm is obtained, which is subjected to conditions of pressure variation until it gradually reaches $10^{-7}$ mbar.

The measure of surface roughness Ra according to standard ISO 4287 was 150 nm; the surface curl was measured as equal to 850 μm.

The product thus manufactured is used as a slab for CIGS thin-film photovoltaic unit applications.

Example 2

The solid components shown in Table 2 below were mixed in a Hobart intensive mixer for 3 minutes.

TABLE 2

| COMPONENTS | Weight % |
| --- | --- |
| Ultracem ® 52,5R cement (Italcementi) | 17.2 |
| Filler D | 20.8 |
| Powder E | 11.1 |
| Aggregate A | 11.1 |
| Aggregate B | 15.1 |
| Aggregate C | 14.9 |
| Driver 72 Axim Italia | 0.4 |
| Seal 200 Elotex | 0.3 |
| Espandex 2000 | 0.4 |

TABLE 2-continued

| COMPONENTS | Weight % |
|---|---|
| Agitan P845 Munzing Chemie | 0.1 |
| Acqua | 8.6 |

The liquid components are then added, including the water, and mixing is continued for a time equal to three minutes as a function of the characteristics of the mixture and of the external temperature. The maximum diameter of the aggregate used is that of aggregate C, equal to 1.5 mm.

The mortar in the fresh state thus obtained is poured by means of a suitable channel into moulds having a micrometric surface roughness. The elevated fluidity allows homogenous filling of the mould, even without the application of vibrations to compact the poured mass. Recourse is preferably made to the use of metallic moulds of the type used for cementitious applications, consisting of two paired halves, the internal surface of which is coated with polycarbonate, capable of imparting to the cementitious product the surface characteristics and roughness that are the subject of the invention. The vertical geometry of the mould enables effective reduction of the phenomenon of curling due to plastic shrinkage that is further accentuated by its pouring into horizontal, open-cast moulds.

After 24 hours it is possible to demould the product to subject it to the seasoning step, which takes place by maintaining it in a vertical position, in a room air-conditioned to 20° C. and 55% relative humidity. A product of dimensions 40×40 cm and thickness equal to 5 mm is obtained, which is subjected to conditions of pressure variation until it gradually reaches $10^{-7}$ mbar.

The measure of surface roughness Ra according to standard ISO 4287 was 70 nm; the surface curl was measured as equal to 700 μm.

The product thus manufactured is used as a slab for CIGS thin-film photovoltaic unit applications.

Example 3

Proceeding substantially as described in Example 2, but using the components described in Table 3 below, a board for ventilated facade for aesthetic purposes was produced.

TABLE 3

| COMPONENTS | Weight % |
|---|---|
| Italbianco ® cement (Italcementi) | 17.2 |
| Filler D | 20.7 |
| Powder E | 11.1 |
| Aggregate A | 11.1 |
| Aggregate B | 15.0 |
| Aggregate C | 14.8 |
| Cimfluid Adagio P1 | 0.4 |
| Seal 200 Elotex | 0.3 |
| Shape 920 Elotex | 0.4 |
| Agitan P845 Munzing Chemie | 0.1 |
| Pigmento Rosso 1020 Siof | 0.4 |
| Water | 8.6 |

The thickness of the slab, of area equal to 60×100 mm², is 15 mm.

The surface roughness, expressed as Ra according to standard ISO 4287, is 500 nm. The curl of the board was measured as 350 μm.

Example 4

Proceeding substantially as described in Example 2, but using the components described in Table 4, a sunshade element was obtained.

TABLE 4

| COMPONENTS | Weight % |
|---|---|
| TX Aria ® cement (Italcementi) | 17.2 |
| Filler D | 20.8 |
| Powder E | 11.1 |
| Aggregate A | 11.1 |
| Aggregate B | 15.1 |
| Aggregate C | 14.9 |
| Driver 72 | 0.4 |
| Seal 200 Elotex | 0.3 |
| Espandex 2000 | 0.4 |
| Agitan P845 Munzing Chemie | 0.1 |
| Water | 8.6 |

The thickness of the 40×40 cm board is 25 mm. The surface roughness, expressed as Ra according to standard ISO 4287, is 400 nm. The curl of the board was measured as 300 μm.

The measure of the photocatalytic activity, evaluated according to the draft standard UNI U87003040, was as follows: 70% reduction in nitrous oxides $NO_x$.

Example 5

Substantially as described in Example 2, but using the components according to Table 5, a fencing board for flexible solar-cell applications was obtained.

TABLE 5

| COMPONENTS | Weight % |
|---|---|
| Ultracem ® 52.5R cement (Italcementi) | 17.2 |
| Filler D | 20.8 |
| Powder E | 11.1 |
| Aggregate A | 11.1 |
| Aggregate B | 15.1 |
| Aggregate C | 14.9 |
| Driver 72 | 0.4 |
| Seal 200 Elotex | 0.3 |
| Espandex 2000 | 0.4 |
| Agitan P845 Munzing Chemie | 0.1 |
| Water | 8.6 |

The internal surface of the mould was coated with Mylar® in place of polycarbonate.

The thickness of the fencing board was 10 mm.

The measure of surface roughness, expressed as Ra according to standard ISO 4287 was 180 nm.

Example 6 Comparative

The following composition was used substantially as described in Example 2:

| | | |
|---|---|---|
| CEM I 52.5 R | % | 33.4 |
| Slurry of silica fume (dry substance) | % | 1.5 |
| Slag | % | 8.7 |
| Aggregate | % | 43.6 |
| Water | % | 12.6 |
| Acrylic superplasticizer (dry substance) | % | 1.17 |
| Water/binder ratio | | 0.29 | wherein the aggregate has $d_{max}$ equal to 2 mm, wherein the anti-shrinkage component III is absent, and wherein the binder/aggregate ratio is approximately 77%.

An attempt was made to manufacture a slab for application in thin-film photovoltaic units, having a thickness of 5 mm as described in Example 1. However, the aggregate— which had $d_{max}$ greater than one third of the thickness of the slab—appeared on the surface, giving rise to obvious defects which made the slab unsuitable for thin-film deposition.

In general it is observed that the final properties of the product of the present invention are the result of combination of a plurality of structural arrangements and provisions of the method, from the composition of the pourable liquid mortar starting substance, to the casting mould selected, with its particular geometry and surfaces. The synergistic combination of such arrangements offers an effective solution to problems of curling which are commonly present in the case of products having a high surface/volume ratio, and in addition enables surfaces of very low roughness to be obtained. Moulding of the product is carried out without segregation phenomena or bleeding, and is especially optimal with the use of moulds having coated vertical walls.

The invention claimed is:

1. Cementitious product having controlled curling and surface roughness, characterised hi that it is manufactured by casting, in a mould, a fluid composition comprising:
   I. a hydraulic binder;
   II. one or more aggregates;
   III. an anti-shrinkage agent;
   IV. a superplasticiser agent;
   V. water,
   wherein the ratio between water and hydraulic binder is higher than 0.30 and the amount by weight of said hydraulic binder in the composition is lower than that of said aggregates, said aggregates have a maximum diameter $d_{max}$ not greater than one third of the thickness of the product,
   said product thus having arithmetic mean surface roughness Ra, measured by non-contact optical profilometer, of not greater than 500 nm and curling, measured by thin-layer shrinkage, of not greater than 1500 micron, and said product does not contain any expanders.

2. The cementitious product according to claim 1, characterised in that the percentage by weight of said hydraulic binder in said composition is not greater than 60% with respect to said aggregates.

3. The cementitious product according to claim 1, characterised in that the thickness of the final product lies in the range from 3 to 50 mm.

4. The cementitious product according to claim 1, characterised in that said one or more aggregates have a maximum diameter $d_{max}$ less that one third of the product thickness.

5. The cementitious product according to claim 1, characterised in that said one or more aggregates together comprise the following fractions; aggregates having a diameter in the range from 0.20 to 0.35 mm, aggregates having a diameter in the range from 0.60 to 0.80 mm, aggregates having a diameter hi the range from 1.00 to 1.50 mm, fillers having a diameter in the range from 0.1 to 40 μm, powders having a diameter in the range from 0.1 to 0.8 mm, marble granules having a diameter in the range from 0.1 to 100 μm and granules having a diameter in the range from 0.10 to 0.60 mm.

6. The cementitious product according to claim 5, characterised in that said one or more aggregates comprise the following fractions A, B, C, D, E, F and G:
   A—a fraction of silico-calcareous alluvial aggregates having a diameter in the range from 0.20 to 0.35 mm,
   B—a fraction of silico-calcareous alluvial aggregates having a diameter hi the range from 0.60 to 0.80 mm,
   C—a fraction of silico-calcareous alluvial aggregates having a diameter in the range from 1.00 to 1.50 mm,
   D—calcareous aggregates having a diameter in the range from 0.1 to 40 μm,
   E—calcareous aggregates having a diameter in the range from 0.1 to 0.8 mm,
   F—marble granules having a diameter hi the range from 0.1 to 100 μm,
   G—marble granules having a diameter hi the range from 0.10 to 0.60 mm in the colours Carrara white and Zandobbio white.

7. The cementitious product according to claim 1, characterised in that said anti-shrinkage agent is selected from the group consisting of a glycol, a diol, a polyol and mixtures thereof; a glycolic ether, a glycolic ether derivative and mixtures thereof.

8. The cementitious product according to claim 1, characterised in that said superplasticiser agent is selected from a solid phase or aqueous solution of a polycarboxylic polymer.

9. The cementitious product according to claim 1, characterised in that said fluid composition further comprises a water-repellent agent.

10. The cementitious product according to claim 9, characterised in that said water-repellent agent is selected from the group consisting of a sodium oleate, an organosilicon substance, and an alkyloxysilane.

11. The cementitious product according to claim characterised in that it further comprises an anti-foaming agent.

12. The cementitious product according to claim characterised in that said hydraulic binder I is a photocatalytic cement.

13. The cementitious product according to claim 1, characterised in that it is in the shape of a board for ventilated facade and for fencing, a roof tile, panelling, or a sunshade element.

14. The cementitious product according to claim 1, characterised in that said one or more aggregates comprise fines and non-fines comprising a filler, a powder or a sand, said one or more aggregates being defined in UNI EN 206 Standard, wherein a portion of said one or more aggregates are fines having a maximum diameter of $d_{max}$, equal to 40 microns, and non-fines having $d_{max}$ greater than 40 microns.

15. The cementitious product according to claim 14, characterised in that the percentage amount of filler relative to that of said one or more aggregates is in the range of 15% to 60%.

16. The cementitious product of claim 1, in form of a non-structural architectonic element.

17. The cementitious product of claim 1, in form of a substrate useful as a thin photovoltaic film.

18. The cementitious product of claim 7, further comprising lime.

19. The cementitious product of claim 1, wherein said cementitious product is in the shape of a slab.

20. A thin-film photovoltaic unit, characterised in that it comprises, as a substrate for the film, a cementitious product of arithmetic mean surface roughness Ra not greater than 500 nm and curling not greater than 1500 micron according to claim 1.

21. A method for manufacturing a cementitious product according to claim 1, characterised hi that it comprises mixing said components I to IV; adding form a liquid mortar; pouring said liquid mortar into a casting mould; hardening and demoulding of the product from the mould.

22. The method according to claim 21, characterised in that wherein said casting mould has vertical walls.

23. The method according to claim 22, characterised in that said casting mould is metallic and has vertical walls for cementitious applications consisting of two half-moulds the internal surface of which is at least partly or completely coated with a material selected from polyethylene terephthalate, polycarbonate, polyamide, and polymethyl methacrylate capable of imparting arithmetic mean surface roughness Ra not greater than 500 nm to the cementitious product during the moulding step.

24. The method according to claim 22, characterised in that said casting mould is metallic and has vertical walls for cementitious applications consisting of a series of several walls distanced and paired, at least partly or completely internally coated, adapted to produce simultaneously a plurality of products of equal or different thickness.

25. A cementitious product having a controlled curling and surface roughness, characterised in that it is manufactured by casting in a mould of a fluid composition consisting of:

I. a hydraulic binder;
II. one or more aggregates;
III. an anti-shrinkage agent;
IV. a superplasticiser agent;
V. water,
wherein the ratio between water and hydraulic binder is higher than 0.30 and the amount by weight of said hydraulic binder in the composition is lower than that of said aggregates, said aggregates have a maximum diameter $d_{max}$ not greater than one third of the thickness of the product, and said product does not contain any expanders, wherein said product has an arithmetic mean surface roughness Ra, measured by non-contact optical profilometer, of not greater than 500 nm and curling, measured by thin-layer shrinkage, of not greater than 1500 micron.

26. The cementitious product of claim 25, wherein said cementitious product is in the shape of a slab.

* * * * *